(12) United States Patent
Subramaniyan et al.

(10) Patent No.: US 9,245,067 B2
(45) Date of Patent: Jan. 26, 2016

(54) PROBABILISTIC METHOD AND SYSTEM FOR TESTING A MATERIAL

(71) Applicant: General Electric Company, Schenectady, NY (US)

(72) Inventors: Arun Karthi Subramaniyan, Clifton Park, NY (US); Shesh Krishna Srivatsa, Cincinnati, OH (US); Don Beeson, Cincinnati, OH (US); Liping Wang, Halfmoon, NY (US)

(73) Assignee: General Electric Company, Niskayuna, NY (US)

( * ) Notice: Subject to any disclaimer, the term of this patent is extended or adjusted under 35 U.S.C. 154(b) by 391 days.

(21) Appl. No.: 13/840,785

(22) Filed: Mar. 15, 2013

(65) Prior Publication Data

US 2014/0278310 A1    Sep. 18, 2014

(51) Int. Cl.
*G06G 7/48* (2006.01)
*G06F 17/50* (2006.01)

(52) U.S. Cl.
CPC .................. *G06F 17/5009* (2013.01)

(58) Field of Classification Search
CPC ............... G06F 17/5009; G06F 17/50
USPC ........................................ 703/2, 6
See application file for complete search history.

(56) References Cited

U.S. PATENT DOCUMENTS

| | | | |
|---|---|---|---|
| 6,063,127 A | 5/2000 | Ziger | |
| 6,278,898 B1 | 8/2001 | Shah | |
| 6,968,326 B2 | 11/2005 | Johnson et al. | |
| 6,988,017 B2 | 1/2006 | Pasadyn et al. | |
| 7,787,696 B2 | 8/2010 | Wilhelm et al. | |
| 8,017,411 B2 | 9/2011 | Sonderman et al. | |
| 2005/0240895 A1* | 10/2005 | Smith et al. | 716/19 |
| 2010/0010788 A1* | 1/2010 | De Crecy | 703/2 |
| 2013/0046517 A1* | 2/2013 | Baym et al. | 703/2 |
| 2013/0204585 A1* | 8/2013 | Basudhar, Anirban | 703/1 |

OTHER PUBLICATIONS

Staum. "Better Simulation Metamodeling: The Why, What and How of Stochastic Kriging". 2009 IEEE. pp. 119-133.*

Hindi. "Approximation of a Discrete Event Stochastic Simulation Using an Evolutionary Artificial Neural Network". 2004. JKAU: Eng. Sci., vol. 15 No. 1, pp. 125-138.*

(Continued)

*Primary Examiner* — Eunhee Kim
(74) *Attorney, Agent, or Firm* — Paul J. DiConza (57) ABSTRACT

A method implemented using a processor based device for simulation based testing of materials, includes selecting a first set of points from a data generated from a design space and generating a stochastic metamodel based on the first set of points. The method also includes determining an uncertainty value based on the stochastic metamodel. The method also includes identifying a second set of points different from the first set of points, from the data generated from the design space, based on the uncertainty value. The method further includes combining the second set of points with the first set of points to generate a third set of points, assigning the third set of points to the first set of points. The method also includes iteratively generating, determining, identifying, combining, and assigning steps till the uncertainty value is less than or equal to a predetermined threshold value.

17 Claims, 10 Drawing Sheets

(56) References Cited

OTHER PUBLICATIONS

Ankenman et al. "Stochastic Kriging for Simulation Metamodeling" Operations Research vol. 58, No. 2, Mar.-Apr. 2010, pp. 371-382.*

Hu et al., "Optimization of Sheet Metal Forming Processes by Adaptive Response Surface Based on Intelligent Sampling Method", Journal of Materials Processing Technology, vol. 197, Issues 1-3, Feb. 2008, pp. 77-88.

Shih et al., "Non-Uniform Surface Sampling Techniques for Three-Dimensional Object Inspection", Optical Engineering—Instrumentation, Measurement, and Metrology, vol. 47, Issue 5, May 12, 2008, pp. 053606-1-053606-15.

Hu et al., "Development of Metamodeling Based Optimization System for High Nonlinear Engineering Problems", Advances in Engineering Software, vol. 39, Issue 8, Aug. 2008, pp. 629-645.

Basudhar et al., "A Sampling-based Approach for Probabilistic Design with Random Fields", Computer Methods in Applied Mechanics and Engineering, vol. 198, Issues 47-48, Oct. 1, 2009, pp. 3647-3655.

Chakraborty et al., "Adaptive Learning for Damage Classification in Structural Health Monitoring", Conference on Signals, Systems and Computers, Nov. 1-4, 2009, pp. 1678-1682.

Kemp Kernstine Jr., "Design Space Exploration of Stochastic System-ofSystems Simulations Using Adaptive Sequential Experiments", Thesis (Ph. D.)—Georgia Institute of Technology, Aug. 2012, 308 Pages.

* cited by examiner

PROBABILISTIC METHOD AND SYSTEM FOR TESTING A MATERIAL

BACKGROUND

The subject matter disclosed herein, generally relates to simulation based design and testing methods. More specifically, the subject matter relates to simulation based testing of materials having non-linear characteristics.

Complex engineering problems require multidisciplinary design and optimization techniques. Design of Experiments (DoE) may be employed to select reduced number of experiments which are used to build efficient metamodels. Such metamodels are used in optimization, testing, and simulation with savings in computations.

Investigation of mechanical behavior of engineering systems is a frequently encountered scenario. The system may be a structure, a material, soft matter such as human tissue or a fluid structure. Material testing refers to determining properties of materials. Typically, hundreds of tests have to be performed to completely understand the material property over a range of design parameters. For example, stress analysis of an alloy material over a range of strain and temperature values may require about two hundred tests. Each of these tests tends to be time consuming and expensive.

Finite element analysis (FEA) may be used to predict material properties. But for reliable analysis, the validity of FEA has to be corroborated by test data which are available in limited amount due to cost considerations.

There is a need for an enhanced and simplified technique to accurately characterize the material in a shorter duration with lesser cost.

BRIEF DESCRIPTION

In accordance with one aspect of the present technique, a method for simulation based testing of materials is disclosed. The method includes selecting a first set of points from a data generated from a design space and generating a stochastic metamodel based on the first set of points. The method also includes determining an uncertainty value based on the stochastic metamodel. The uncertainty value is representative of variability of a prediction value generated from the stochastic metamodel. The method also includes identifying a second set of points different from the first set of points, from the data generated from the design space, based on the uncertainty value. The method further includes combining the second set of points with the first set of points to generate a third set of points, and assigning the third set of points to the first set of points. The method further includes iteratively generating, determining, identifying, combining, and assigning till the uncertainty value is less than or equal to a predetermined threshold value.

In accordance with one aspect of the present systems, a system for simulation based testing of materials is disclosed. The system includes a processor based device configured to select a first set of points from a data generated from a design space and generate a stochastic metamodel based on the first set of points. The processor based device is further configured to determine an uncertainty value based on the stochastic metamodel. The uncertainty value is representative of variability of a prediction value generated from the stochastic metamodel. The processor based device is further configured to identify a second set of points different from the first set of points, from the data generated from the design space, based on the uncertainty value. The processor based device is also configured to combine the second set of points with the first set of points to generate a third set of points, and assign the third set of points to the first set of points. The processor based device is further configured to iteratively generate, determine, identify, combine and assign till the uncertainty value is less than or equal to a predetermined threshold value.

In accordance with another aspect of the present technique, a non-transitory computer readable medium encoded with a program for simulation based testing of materials, to instruct a processor based device is disclosed. The program instructs the processor based device to select a first set of points from a data generated from a design space and generate a stochastic metamodel based on the first set of points. The program also instructs the processor based device to determine an uncertainty value based on the stochastic metamodel. The uncertainty value is representative of variability of a prediction value generated from the stochastic metamodel. The program further instructs the processor based device to identify a second set of points different from the first set of points, from the data generated from the design space, based on the uncertainty value. The program also instructs the processor based device to combine the second set of points with the first set of points to generate a third set of points, and assign the third set of points to the first set of points. The program also instructs the processor based device to iteratively generate, determine, identify, combine and assign till the uncertainty value is less than or equal to a predetermined threshold value.

DRAWINGS

These and other features and aspects of embodiments of the present invention will become better understood when the following detailed description is read with reference to the accompanying drawings in which like characters represent like parts throughout the drawings, wherein.

DETAILED DESCRIPTION

Embodiments of the present invention relate to a system and a method for generating a metamodel used for testing or simulations associated with engineering design problems. A first set of points is selected from data generated from a design space. A stochastic metamodel is generated based on the first set of points. An uncertainty value is determined based on the stochastic metamodel, wherein the uncertainty value is representative of variability of a prediction value generated from the stochastic metamodel. A second set of points, different from the first set of points, is identified from the data generated from the design space based on the uncertainty value. The second set of points is combined with the first set of points to generate a third set of points. The third set of points is then assigned to the first set of points. The steps discussed herein are iteratively performed till the uncertainty value is less than or equal to a predetermined threshold value.

Figure 1:
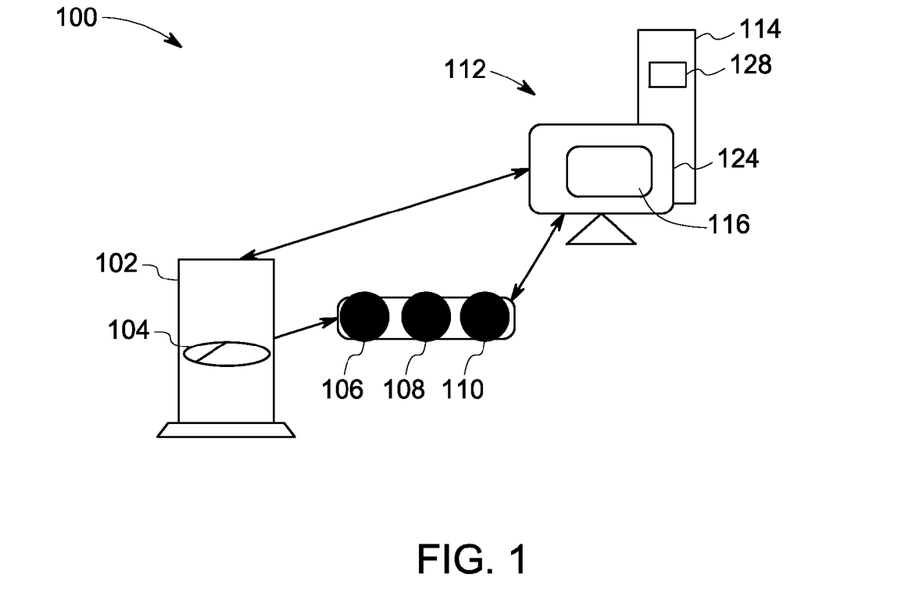
FIG. 1 is a diagrammatic illustration of a system used for testing a material, in accordance with an exemplary embodiment.

FIG. 1 illustrates a system 100 for material testing in accordance with an exemplary embodiment of the present techniques. The system 100 includes a test facility 102 having a placeholder 104 for receiving a test sample (not shown), for example an alloy. The system 100 further includes a plurality of measurement devices 106, 108, 110 to measure a plurality of parameters associated with the test sample. For example, the measurement device 106 may be used for measuring temperature of the test sample, the measurement device 108 may be used to measure strain-rate of the test sample, and the measurement device 110 may be used to measure stress experienced by the test sample, as a function of temperature and strain-rate. In certain other embodiments, additional measurement devices may also be used for other testing or design experiments. The measured parameters are received by a computer system 112 to characterize the test sample under consideration. The measurement devices 106, 108, 110 can communicate with the computer system 112 via wired or wireless communication schemes.

The computer system 112 includes a processor based device 114 for performing computations associated with generating a metamodel (not shown). In accordance with one exemplary embodiment, the metamodel is a stochastic metamodel. The stochastic metamodel is explained in greater detail with respect to subsequent figures. The processor based device 114 may include an optimizer module 128 for reducing the number of computations required to generate the metamodel. In this example, a display device 124 coupled to the computer system 112 and is used to display a plurality of characteristics 116 of the test sample. In other embodiments the plurality of characteristics 116 can be stored, printed or communicated elsewhere.

The processor based device 114 may include at least one controller, general purpose processor, or Digital Signal Processor (DSP). The processor based device may receive additional inputs from a user through a control panel or any other input device such as a keyboard of the computer system 112. The processor based device 114 is configured to access computer readable memory modules including, but not limited to, a random access memory (RAM), and read only memory (ROM) modules. The memory medium may be encoded with a program to instruct the processor based device to enable steps to determine material characteristics. In one embodiment, the computer system 112 may be a standalone system and communicatively coupled to the test facility 102. In another embodiment, the computer system 112 may be integrated with the test facility 102.

Figure 2:
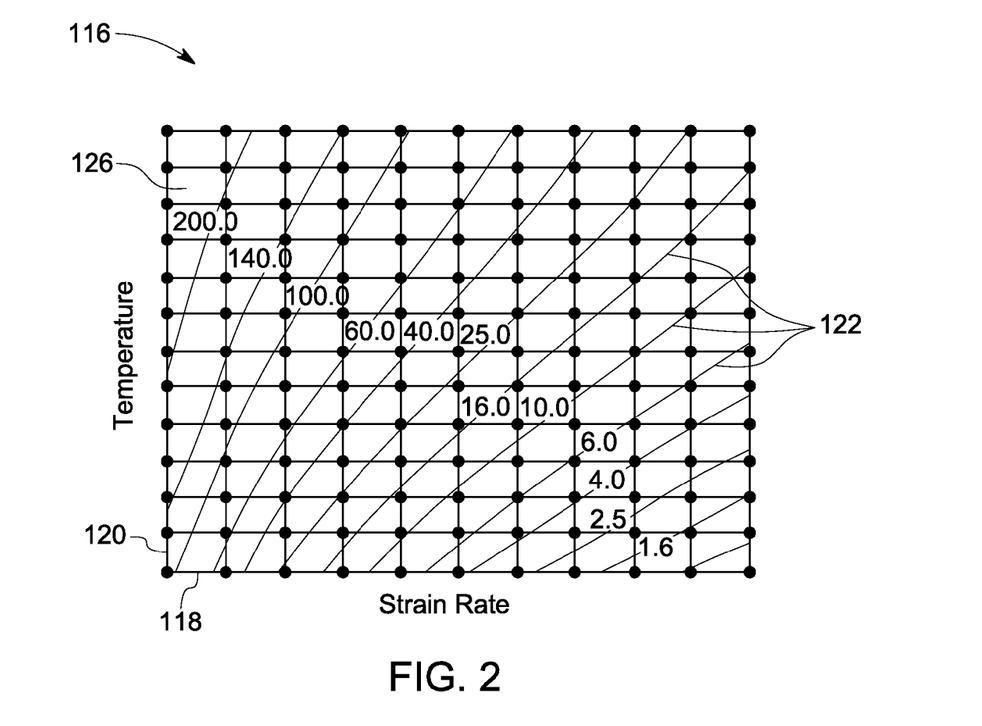
FIG. 2 is a graph depicting characteristics of a material subjected to testing using the system of FIG. 1 in accordance with an exemplary embodiment.

FIG. 2 is a plot 116 depicting the characteristics of the material subjected to testing using the system of FIG. 1 in accordance with an exemplary embodiment. In the illustrated embodiment, the plot 116 is representative of stress analysis for a given value of strain. The x-axis 118 of the plot 116 is representative of strain-rate and the y-axis 120 is representative of temperature. The strain values may be represented along another axis (not shown). The exemplary plot 116 is generated using eleven strain-rate values and thirteen temperature values. It should be noted herein that in the exemplary embodiment, the combination of strain-rate, temperature and strain values form a "design space" 126. In the illustrated embodiment, there are one hundred and forty three points associated with the combination of strain-rate and temperature values in the design space. The term "point" is used herein interchangeably with the term "data point" and both the terms refer to a combination of variable values associated with the design space. As used herein, a stress value corresponds to each of the combinations of strain-rate, and temperature values. The curves 122 are representative of equal valued stress responses generated for different combinations of strain-rate and temperature values corresponding to a particular strain value. It should be noted herein that the exemplary plot 116 is generated for a specific value of strain. In accordance with the embodiments of the present techniques, in a material testing experiment, a plurality of strain values are used along with the combination of strain-rate and temperature values. For example, when fifteen strain values are considered, the design space includes two thousand one hundred and forty five points (i.e., fifteen strain values, eleven strain-rate values, and thirteen temperature values). In the illustrated embodiment, a subset of one hundred and forty three points of the design space are used to generate the stochastic metamodel. In one embodiment, eighteen points out of a total one hundred and forty three points, corresponding to each value of strain are used for generating the stochastic metamodel. In another embodiment, about thirty points out of the one hundred and forty three points, are used for generating the stochastic metamodel. It should be noted herein that the selection of an optimal set of points is performed using an intelligent point selection technique. The technique of intelligent point selection and its various embodiments are explained in greater detail below with reference to subsequent figures. It should be noted herein that the number of points, values, parameters listed herein are not all inclusive and should not be construed as limiting the scope of the system.

Figure 3:
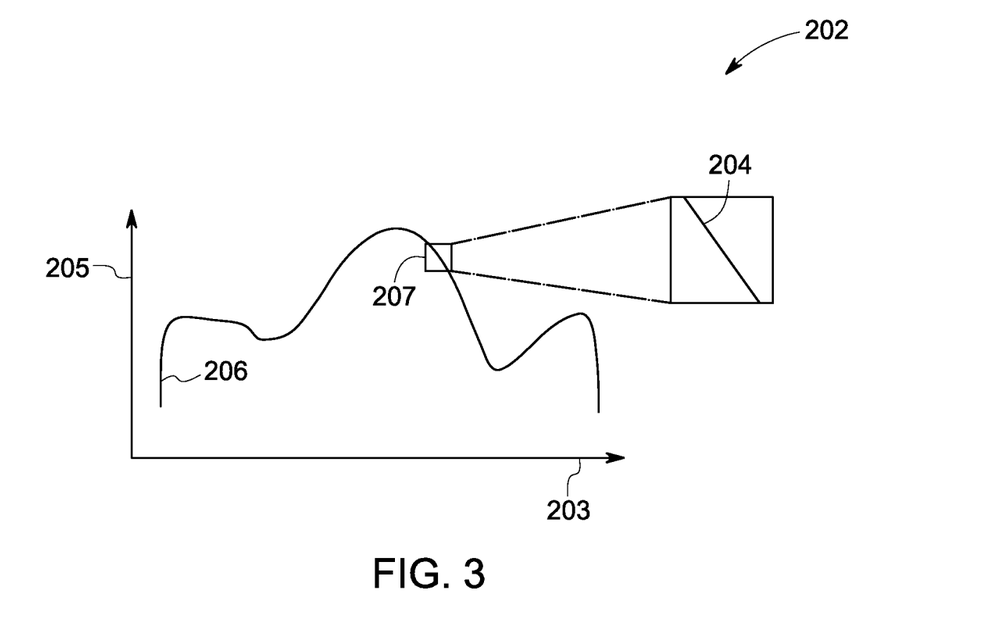
FIG. 3 illustrates a linear metamodel in accordance with an exemplary embodiment.

FIG. 3 illustrates a graphical representation 202 of an exemplary metamodel. The plot 202 illustrates a linear metamodel 204 in a two dimensional design space. Metamodels are basically, simplified representation of complex models of a physical system. The x-axis 203 is representative of a region of operability of a system model 206 of a physical model. The y-axis is representative of magnitude of the system model 206. In the illustrated embodiment, the linear metamodel 204 characterizes the system model 206. A region of interest 207 of the system model is modeled as a linear equation using the linear metamodel 204.

Figure 4:
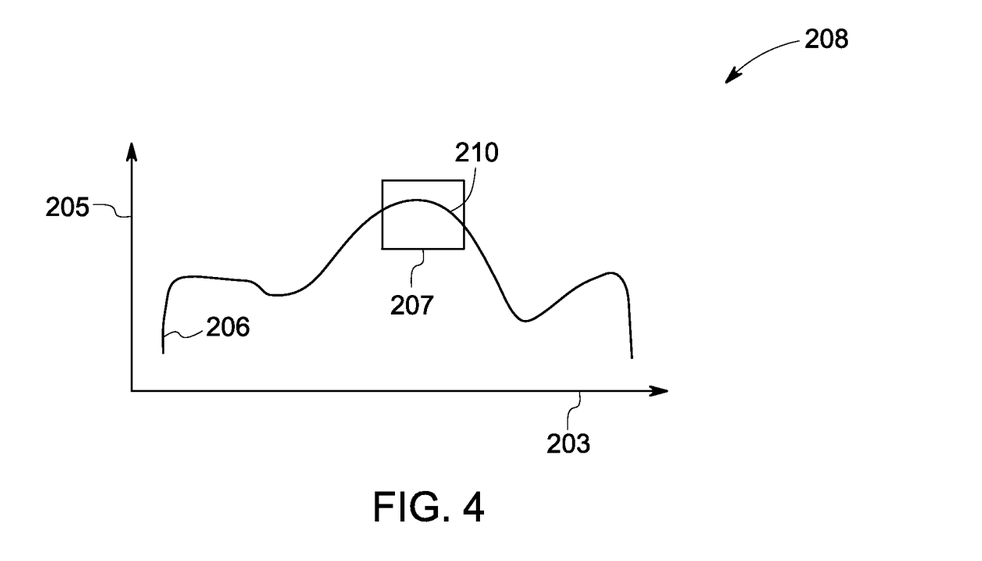
FIG. 4 illustrates a polynomial metamodel in accordance with an exemplary embodiment.

FIG. 4 illustrates a graphical representation 208 of another exemplary metamodel of the system model 206. The plot 208 illustrates a polynomial metamodel 210 representative of another portion of the system model 206. The region of interest 207 in this example is a larger region than the region of interest 204 of FIG. 3 and is modeled as a polynomial equation by the polynomial metamodel 210.

Figure 5:
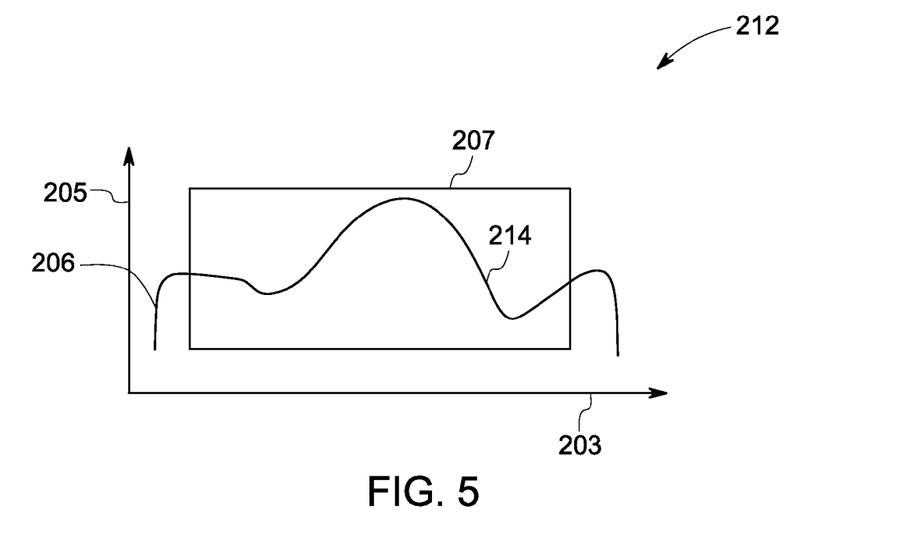
FIG. 5 illustrates a non-polynomial metamodel in accordance with an exemplary embodiment.

FIG. 5 illustrates yet another exemplary metamodel of the system model 206 in accordance with an exemplary embodiment. The plot 212 illustrates a non-polynomial metamodels 214 representing yet another portion of the system model 206. The region of interest 207 in this example cannot be modeled using either a linear equation or a polynomial equation. The linear metamodel 204, polynomial metamodel 210 and a non-polynomial metamodel 214 are some examples of local metamodels. It should be noted herein that local metamodels approximate the system models in a limited region of interest. Other forms of local metamodels may also be used for characterizing the system model. In certain other embodiments, a global metamodel may also be used in the system of FIG. 1. Global metamodels characterize the system model using global approximating functions.

Figure 6:
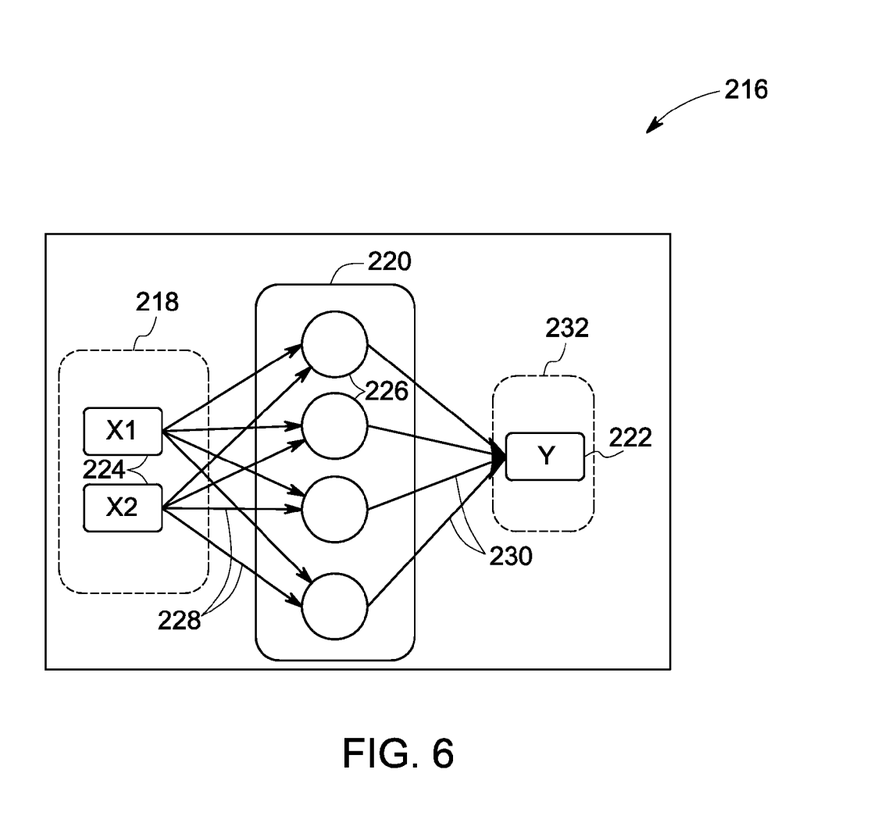
FIG. 6 illustrates an artificial neural network metamodel in accordance with an exemplary embodiment.

FIG. 6 is a schematic representation 216 of a global metamodel in accordance with an exemplary embodiment. The schematic representation 216 illustrates an artificial neural network (ANN) for characterizing the system model in accordance with an exemplary embodiment. The artificial neural network includes an input layer 218 and an output layer 232 and at least one hidden layer 220. A plurality of nodes 224 of the input layer 218 are coupled to a plurality of nodes 226 of the hidden layer 220 via a set of weighting factors also referred to as weights 228. Each node 226 of the hidden layer 220 receives a set of weights 228 and is activated by a suitable function such as a sigmoid function. It should be noted herein that in this example, the set of weights are multiplication factors.

For a single hidden layer neural network, nodes 226 of the hidden layer 220 are coupled to a plurality of output nodes 222 (only one node is shown) of the output layer 232 via another set of weights 230. The output nodes 222 of the output layer 232 are activated using suitable activation functions. Although, in the illustrated embodiment, the artificial neural network is used as a global metamodel, other global metamodels may also be used. For example, in a further embodiment, radial basis functions are used as a global metamodel of the system model. Other global metamodels using polynomial functions are also envisioned in alternate embodiments. In a specific embodiment, the metamodel may also be a stochastic metamodel. In accordance with another embodiment, stochastic metamodels are used to characterize the system model. Both local metamodels and the global metamodels may use probabilistic functions to generate stochastic metamodels. In one embodiment, the metamodel may be generated using a Gaussian process model. A stochastic metamodel may be interpreted as a plurality of deterministic metamodels associated with a plurality of probability values. A stochastic metamodel may also be interpreted as a metamodel defined using one or more probabilistic functions. In accordance with an exemplary embodiment, a global stochastic model in the form of an artificial neural network is used in the system of FIG. 1 to characterize the test sample.

Figure 7:
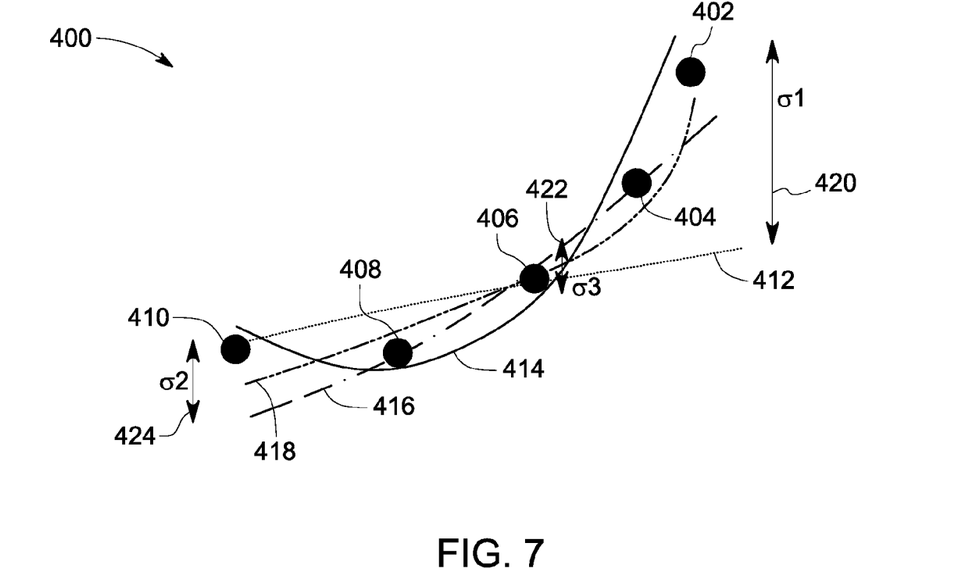
FIG. 7 illustrates a graphical representation of a stochastic metamodel in accordance with an exemplary embodiment.

FIG. 7 illustrates a stochastic metamodel 400 designed in accordance with an exemplary embodiment. The stochastic metamodel 400 is designed based on a first set of points 402, 404, 406, 408, 410. The stochastic metamodel 400 is formed by four deterministic metamodels 412, 414, 416, 418. In the illustrated embodiment, the metamodels 412, 414, 416, and 418 are evaluated at the point 402 to generate four prediction values. A variability 420 of the prediction values is representative of an uncertainty value $\sigma_1$ of the prediction values at the point 402. Similarly, the metamodels 412, 414, 416, 418 are evaluated at the point 410 to generate another set of four prediction values. A variability 424 of the prediction values represents an uncertainty value $\sigma_2$ of the prediction value at the point 410. As another example, a variability 422 of prediction values at the point 406 representative of an uncertainty value $\sigma_3$ is illustrated in the figure. In the same way, uncertainty value of the prediction value of the stochastic metamodel may be determined at all points in the design space.

In one embodiment, the variability is computed as a standard deviation of a plurality of prediction values. The variability may be computed using any other suitable statistical parameters corresponding to the plurality of prediction values. In an exemplary embodiment, a range of the prediction values of the stochastic metamodel is determined. Since, the uncertainty value represents variability of the prediction values, the range may constitute a maximum value of the uncertainty values $\sigma_1$, $\sigma_2$, $\sigma_3$. In other embodiments, the range may be any other suitable statistical property of the plurality of uncertainty values. In one example, the range may be a difference between a maximum value and a minimum value among the plurality of uncertainty values. In another example, the range is a median value of the plurality of uncertainty values. In another example, the range is a tail probability of a probability distribution associated with the prediction values of the stochastic metamodel. It should be noted that the number of uncertainty values, the number of points in the first set of points or the number of deterministic metamodels discussed herein should not be construed as a limitation.

Figure 8:
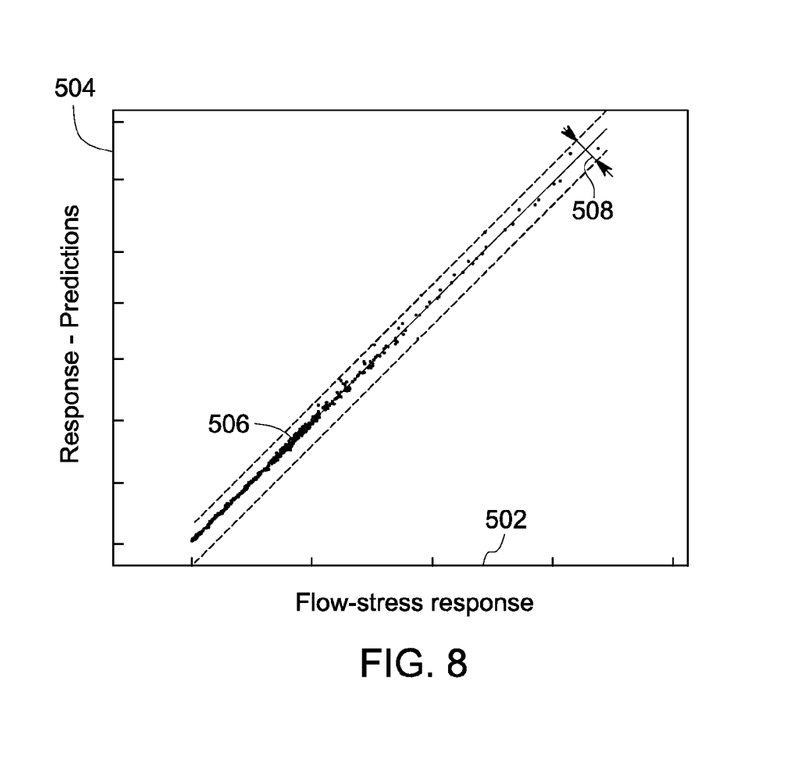
FIG. 8 illustrates a graphical representation of variability of prediction values generated from a metamodel in accordance with an exemplary embodiment.

FIG. 8 illustrates a plot of predicted values 506 of a metamodel as a function of actual data values at all points of a design space. The x-axis 502 represents flow stress response data and the y-axis 504 represents prediction values of the flow stress. A range 508 of the prediction values represents a variability of the prediction values across the design space. In one embodiment, the predicted values 506 may be considered for most of the points of the design space. In another embodiment, the predicted values 506 may be considered for a part of the design space.

Figure 9:
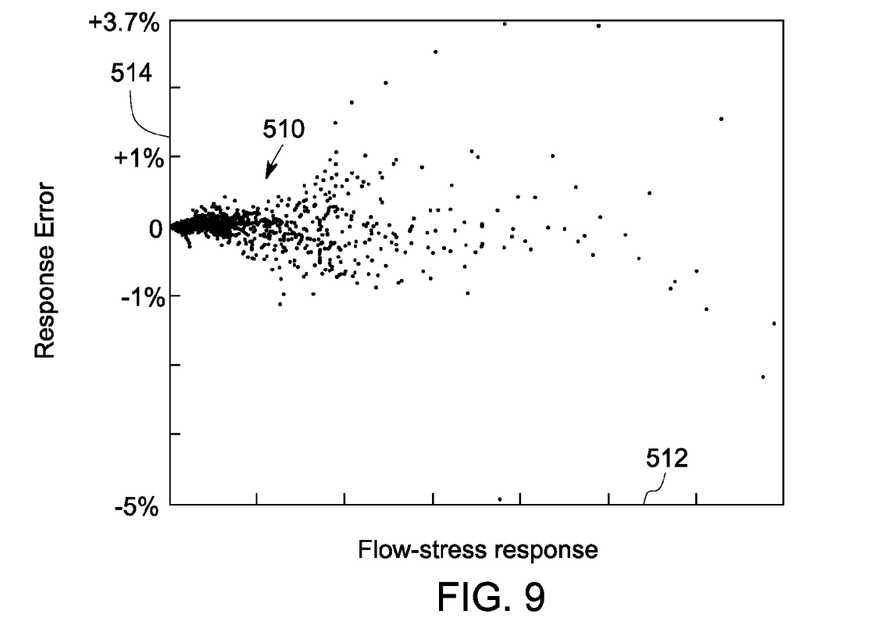
FIG. 9 illustrates a plot of prediction error values versus stress values for a plurality of data points in a design space in accordance with an exemplary embodiment.

FIG. 9 illustrates a prediction error plot at all data points in the design space. The x-axis 512 represents the flow stress response values and the y-axis 514 represents the prediction error values. Each dot 510 on the plot represent an error value corresponding to a data point for a given metamodel. In the illustrated embodiment, the flow stress prediction error values are spread between about −5% to +5%. It may be observed from the plot that most of the prediction error values specifically fall within a range of about −1% to +1%.

Figure 10:
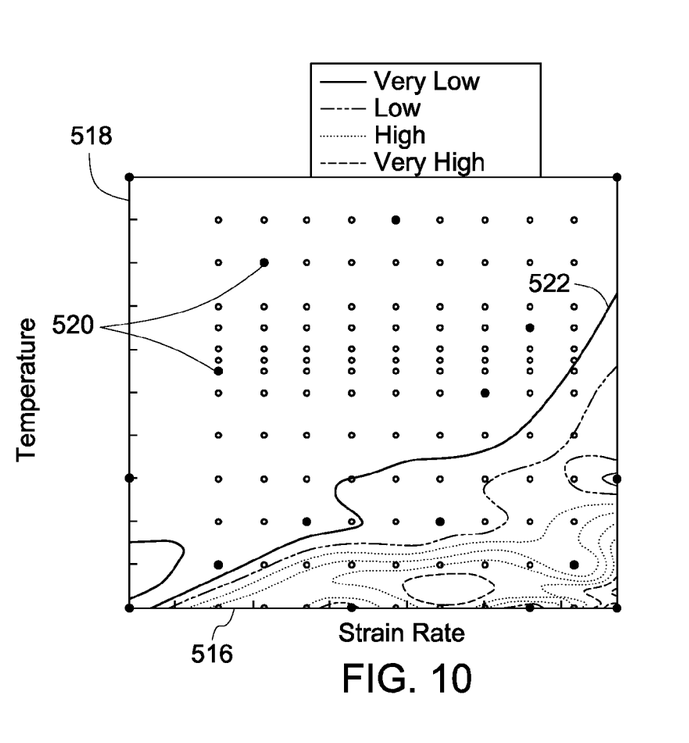
FIG. 10 is a plot illustrating a plurality of uncertainty values in a design space defined by a plurality of temperature and strain-rate values in accordance with an exemplary embodiment.

FIG. 10 is a graphical representation of a plurality of uncertainty values in a design space defined by a plurality of temperature and strain-rate values in accordance with an exemplary embodiment. The x-axis 516 is representative of strain-rate values and the y-axis 518 is representative of the temperature values. A plurality of test points 520 are considered for designing a stochastic metamodel. The metamodel is used to generate a standard deviation of the prediction error values. The curve 522 is representative of the data points in the design space, having equal uncertainty values (prediction variability) in the metamodel. It may be noted that the right side of the x-axis of the graph has higher uncertainty values.

Figure 11:
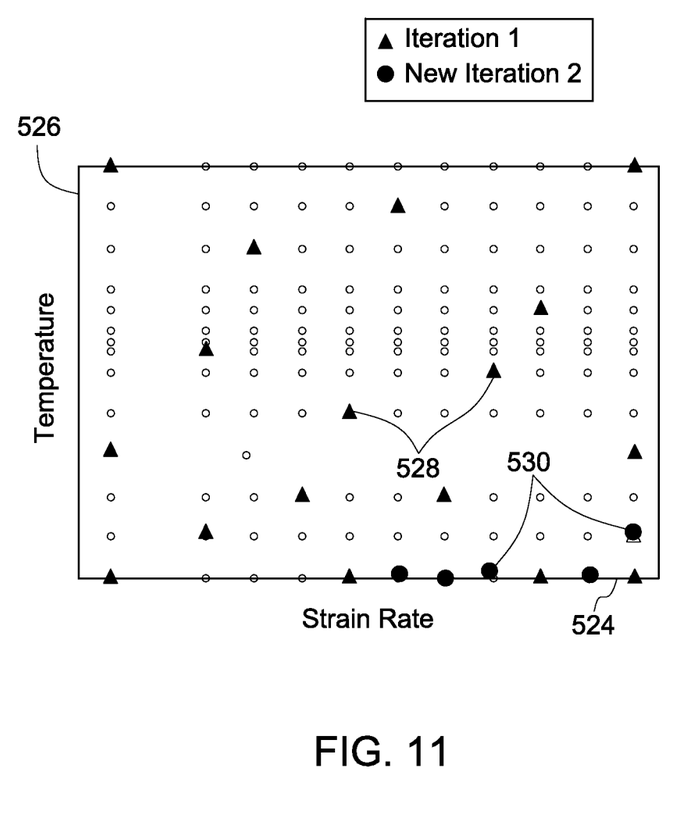
FIG. 11 is a plot showing the selection of a set of points from a plurality of data points in a design space in accordance with an exemplary embodiment.

FIG. 11 is a plot illustrating selection of a set of points from the data of a design space in accordance with an exemplary embodiment. The x-axis 524 is representative of strain-rate values and the y-axis 526 is representative of the temperature values. The plurality of data points 528, represented by small triangles, are representative of a first set of points used to design the stochastic metamodel. A second set of points 530 are identified in a region where the standard deviation of the prediction values are of relatively higher values. The plurality of data points of the second set of points 530 are represented by small circles.

Figure 12A:
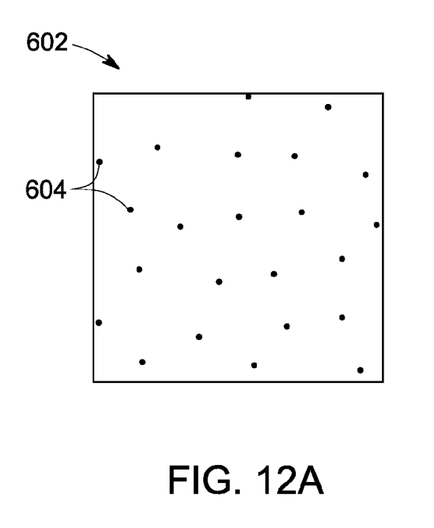
FIG. 12A, FIG. 12B, FIG. 12C, and FIG. 12D are plots illustrating steps involved in an intelligent point selection technique in accordance with an exemplary embodiment.
Figure 12B:
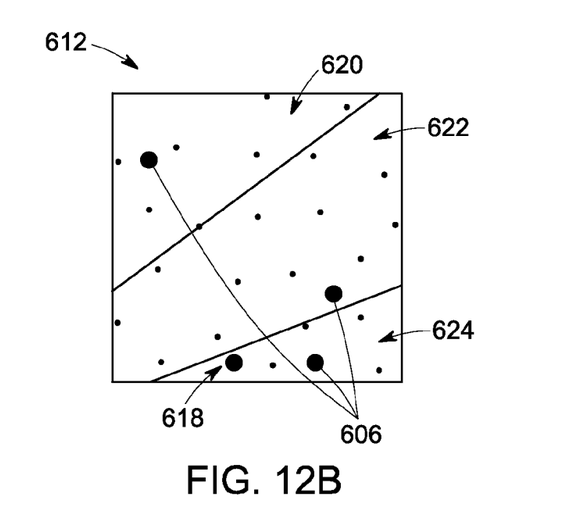
Figure 12C:
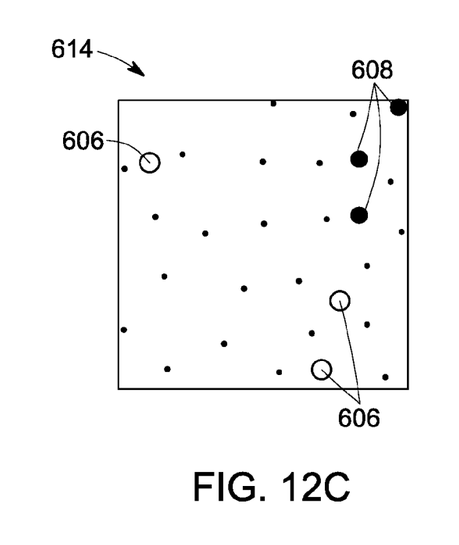
Figure 12D:
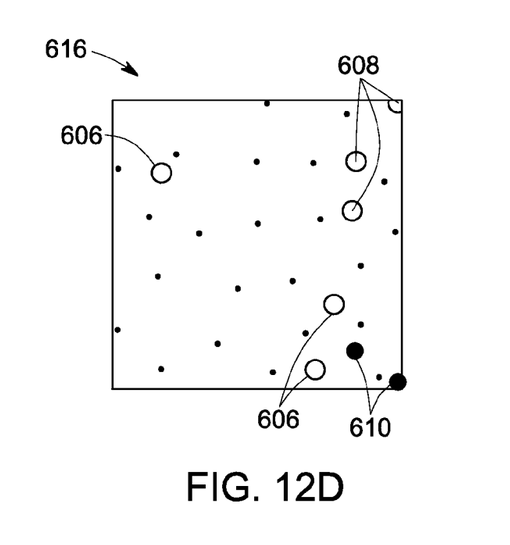

FIG. 12A is a plot illustrating a first iteration 602 of an intelligent point selection technique in accordance with an exemplary embodiment. FIG. 12B is a plot illustrating a second iteration 612 of the proposed technique. FIG. 12C is a plot illustrating a third iteration 614 and FIG. 12D is a plot illustrating a fourth iteration 616 of the technique in accordance with an exemplary embodiment. A plurality of first set of points 604 are selected in the first iteration 602 of FIG. 12A to design a stochastic metamodel. In the second iteration 612 of FIG. 12B, a second set of points 606 are identified using the exemplary intelligent point selection technique discussed herein. The second set of points 606 are identified in a region where the prediction variability of the stochastic metamodel is relatively high as explained with reference to the FIGS. 8-11. The second set of points 606 are distinct from the first set of points 604. The second set of points 606 are selected from a plurality of randomly selected regions distributed along the design space.

In the illustrated embodiment, corresponding to the second iteration 612, three regions 620, 622, 624 are shown distributed along the design space. Each of the plurality of regions 620, 622, 624 may have a plurality of points with high prediction variability. The second set of points 606 are selected from these regions 620, 622, 624. In the illustrated embodiment, additionally, a point 618 in the region 624 has a high prediction variability. But, the point 618 is not selected as part of the second set of points 606 to avoid selecting more points from the same region. Although all the three regions 620, 622, 624 are considered in the illustrated embodiment, some of the regions may be excluded while selecting the second set of points. In one embodiment, the regions may be considered in a random fashion. In another embodiment, regions with higher prediction variability are considered. The number of points and the number of regions discussed herein should not be construed as a limitation.

In the third iteration 614 of FIG. 12C, the first set of points 604 and the second set of points 606 are used for designing the stochastic metamodel. Based on the prediction variability of the stochastic metamodel, another set of points 608, are identified.

In the fourth iteration 616 of FIG. 12D of the intelligent point selection technique, another set of points 610, are identified where the prediction variability of the stochastic metamodel is high. In such a manner, more number of data points are selected sequentially from the design space till the prediction variability of the stochastic metamodel is reduced below a predetermined threshold. The number of data points selected at each iteration step may be determined based on a time duration required to perform testing experiments. For example, if ten testing experiments are completed in a day, the number of data points may be set to a value of ten. In another example, if one test experiment is completed in a day, the number of data points may be set to a value of one.

Figure 13:
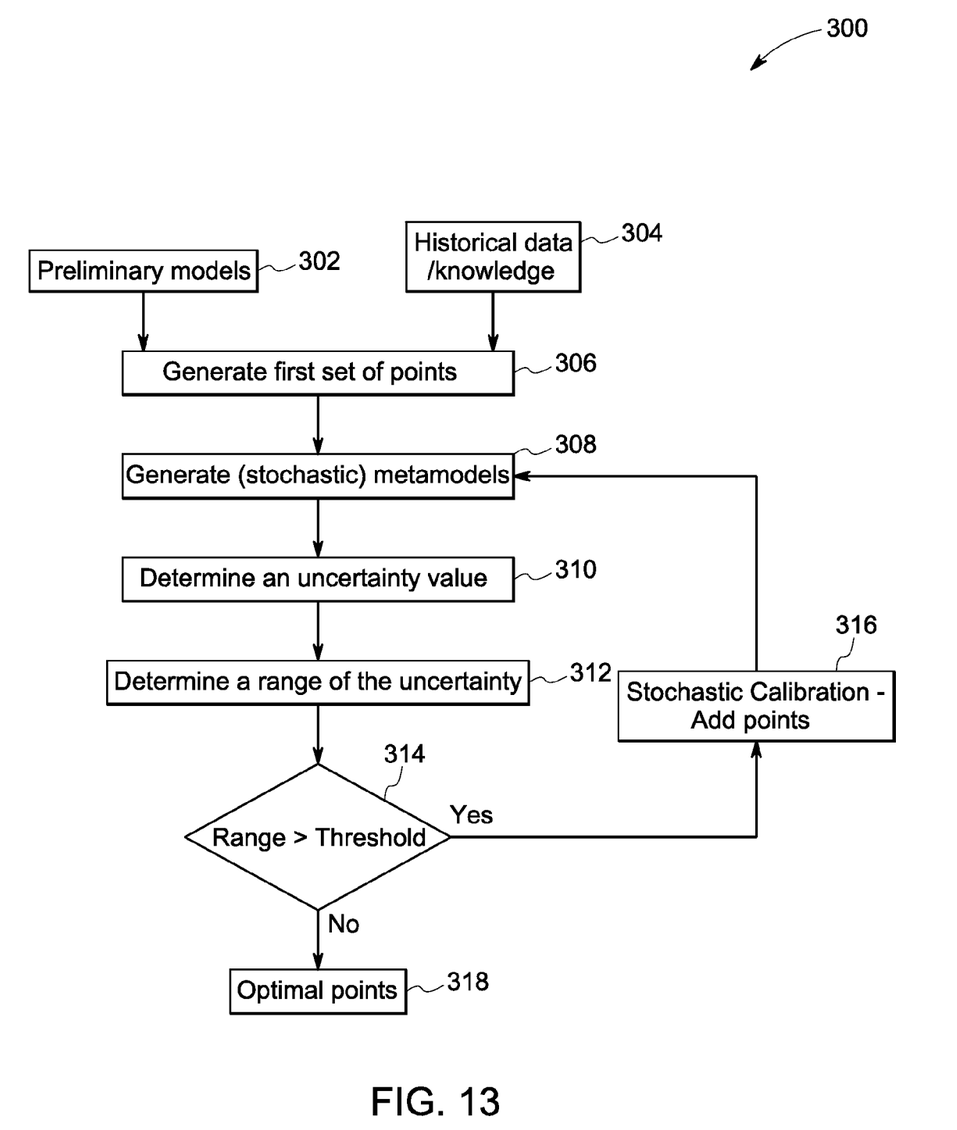
FIG. 13 illustrates a flow chart of a probabilistic testing technique in accordance with an exemplary embodiment.

FIG. 13 illustrates a flowchart 300 illustrating exemplary steps involved in designing a metamodel for a system model in accordance with an exemplary embodiment. A first set of points 306 is selected from a data generated from a design space corresponding to the system under consideration. In one embodiment, the data may be generated from a processor based device employing preliminary models 302. The preliminary models may be an approximation of the system model such as linear or lower order polynomial models. In another embodiment, the data may also be derived from historical data/knowledge 304. The historical data may be stored in a memory of the processor based device. It may also be noted herein that the data may also refer to a test data generated by experimentation performed by the system of FIG. 1.

The data has a plurality of points obtained from a plurality of randomly selected regions distributed along the design space as explained previously in relation to the FIGS. 12A-12D. The first set of points may be alternatively referred to as a "design of experiment" (DoE). A DoE is a n×k matrix of n points in the design space of k-dimensions. The requirement of metamodelling is to choose n points that are sufficient to design a metamodel which is used to characterize the system model. A metamodel is generated 308 based on the first set of points 306 identified in the design space. The metamodels may be any of the models including those that were explained with reference to FIGS. 3-6. In one exemplary embodiment, an artificial neural network is used as the metamodel. Generating the metamodel determining the values of the weights associated with the artificial neural network.

In an exemplary embodiment, a stochastic global metamodel is designed based on the first set of points. The stochastic metamodel may include a plurality of metamodels generated from the first set of points. For example, designing each of the plurality of metamodels of a stochastic metamodel may involve three steps. In the first step, a plurality of model parameters may be determined using about eighty percent of the data points of the first set of points. In the second step, the metamodel may be validated using ten percent of the remaining data points of the first set of points. In the third step, the metamodel is tested using the remaining ten percent of the data points of the first set of points. Similarly, each of the metamodel of the stochastic metamodel may be determined.

In one embodiment, the stochastic metamodel uses an artificial neural network having twenty nodes in the hidden layer. In a specific embodiment, about eighteen points may be considered as a first set of points (for each of the thirteen strain values along the other axis). In one embodiment, the stochastic metamodel may include thirty deterministic metamodels. In another embodiment, the number of deterministic metamodels in the stochastic metamodel may be in the range of 30-100. In one example, about twelve data points among the first set of points may be used for training and the remaining six data points may be used for validation and testing purposes. In other examples, the number of data points may be varied. In one specific example, the number of nodes in the hidden layer of the artificial neural network may be around twenty. In another embodiment, about 5-10% of the total number of data points in the design space may be included in the initial first set of points. The nature of the testing or design problem dictates selection of such parameters discussed herein.

The stochastic metamodel generated in step 308 may be evaluated at each point in the design space to generate a prediction value corresponding to each point. An uncertainty value corresponding to the prediction value is determined 310. The prediction value generated by evaluating the stochastic metamodel includes a plurality of prediction values.

Alternatively, the plurality of prediction values may be interpreted as outputs of a plurality of deterministic metamodels. A statistical parameter of the plurality of prediction values is determined as an uncertainty value at each point in the design space. The statistical parameter may be a standard deviation of the plurality of prediction values of the stochastic metamodel corresponding to each point in the design space. In one embodiment, the statistical parameter may be a "kurtosis value". Any other statistical value representative of a central tendency of the plurality of prediction values may also be used. It should be noted herein that the uncertainty value corresponding to a point in the design space quantifies the prediction variability of the stochastic metamodel at the particular point.

The flow chart further includes determining a range 312 for the plurality of statistical parameter values corresponding to all data points of the design space as explained previously with respect to FIG. 7. In one example, the range may be a difference between a maximum value and a minimum value among a plurality of response values in the design space. In another example, where the statistical parameter is representative of variability of response values, the range may constitute a maximum value of the statistical parameter values.

The range is compared with a predetermined threshold 314 to verify that the stochastic metamodel is optimal and to establish optimal points. If the range is greater than the predetermined threshold, the stochastic metamodel is modified by further steps explained in the subsequent paragraphs. If the range is smaller or equal to the predetermined threshold value, the stochastic metamodel is sufficiently accurate and the set of first points are considered as the optimal set of points 318. In one embodiment, the predetermined threshold value is set based on historical statistics corresponding to the statistical parameter values of the design space. In another embodiment, the predetermined threshold value is also determined based on user requirements with reference to the accuracy of the stochastic metamodel.

The modification of metamodel is performed using a stochastic calibration technique 316. According to an exemplary embodiment, a second set of points is selected based on the plurality of uncertainty values. A maximum value among the plurality of uncertainty values is identified and the point corresponding to the maximum value is included in the second set of points. Subsequently, a second maximum value among the plurality of uncertainty values is determined. The point in the design space corresponding to the second maximum value is also included in the second set of points. In this manner, a predetermined number of points from the design space are included in the second set of points. The number of such points may be decided apriori. In one embodiment, five points may be identified as second set of points. In another embodiment, ten points may be identified as the second set of points.

In some embodiments, an optimizer may select the points to be included in the second set of points based on the uncertainty values. The optimizer may identify a plurality of points from the design space with relatively higher uncertainty values. In certain embodiments, the optimizer may choose the plurality of points from a plurality of randomly selected regions distributed along the design space.

It should be noted herein that, the selection of the second set of points in one example, includes two intermediate steps. In the first intermediate step, a subset of data points is identified in the design space based on the plurality of uncertainty values corresponding to the data points of the design space. In the second intermediate step, test data is generated for the identified subset of data points. The system of FIG. 1 is used for performing testing experiments to generate the test data. Generating the test data in many real life scenarios is time consuming and costly. Selection of limited number of points in the second set and generating limited test data helps in conducting reduced number of tests. The second set of points and the first set of points are combined to generate a third set of points. The third set of points is an enlarged set having data points from both the first set of points and the second set of points. The third set of points is assigned to the first set of points before initiating the first step of the next iteration.

Figure 14A:
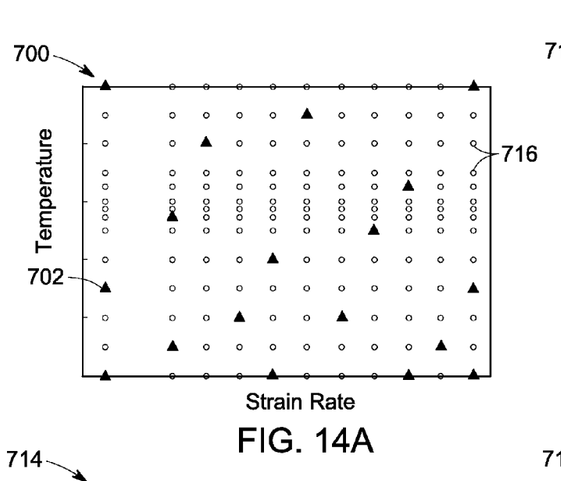
FIG. 14A, FIG. 14B, FIG. 14C, and FIG. 14D are plots illustrating iterations of an intelligent point selection technique applied to a flow stress analysis for forge modeling in an alloy development scenario in accordance with an exemplary embodiment.
Figure 14B:
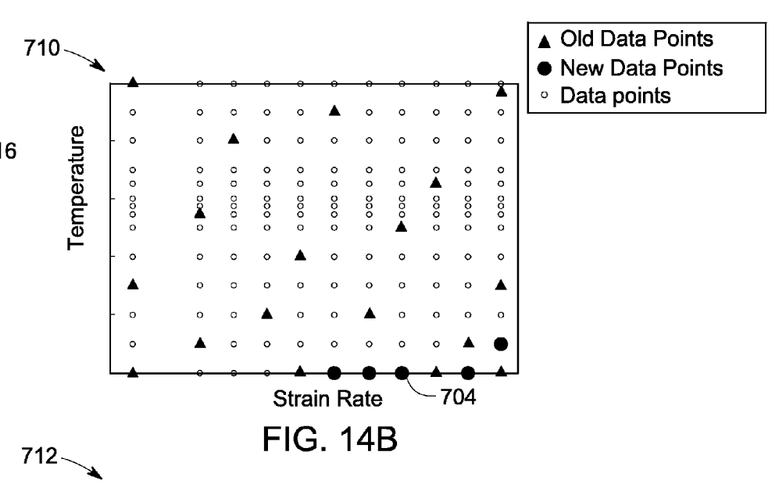
Figure 14C:
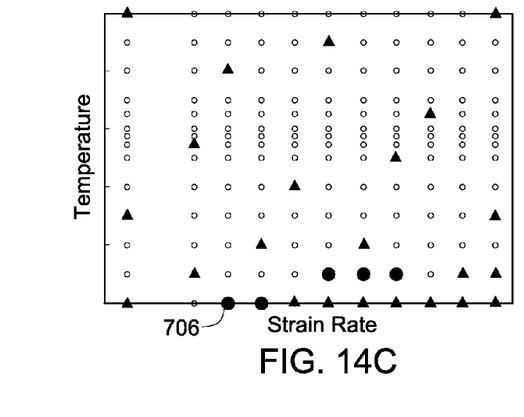
Figure 14D:
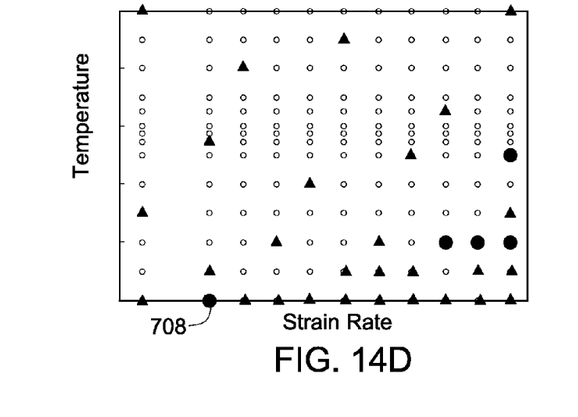

FIG. 14A is a plot illustrating a first iteration 700 of an intelligent point selection technique applied to a flow stress analysis for forge modeling in an alloy development scenario in accordance with an exemplary embodiment. FIG. 14B is a plot illustrating a second iteration 710 of the proposed technique. FIG. 14C is a plot illustrating a third iteration 712 and FIG. 14D is a plot illustrating a fourth iteration 714 associated with the choosing of data points with reference to a plurality of temperature and strain-rate values. The x-axis of each plot is representative of strain-rate values and the y-axis is representative of temperature values. The exemplary plots of the design space include one hundred and fifty one data points 716, eleven strain-rate values, and fourteen temperature values and thirteen strain values at each of the one hundred and fifty one data points. In the first iteration 700, eighteen data points 702 are considered among the one hundred and fifty one data points 716 of the design space for generating the stochastic metamodel. In the second iteration 710, additional data points 704 are considered for enhancing the stochastic metamodel. Although, in the illustrated example, five additional data points 704 are selected, numbers of additional data points may vary depending on the application.

With reference to the second iteration 710, the eighteen data points 702 may be referred to as a first set of data points and the additional data points 704 may be referred to as a second set of data points. Thus, in the second iteration, twenty three data points 702, 704 are considered for generating stochastic metamodel. In the third iteration 712, five more additional points 706 are identified, and hence twenty eight points 702, 704, 706 are available for generation of the stochastic metamodel.

In the third iteration 712, twenty three points 702, 704 are referred to as the first set of points and five additional data points 706 are referred to the second set of points. Similarly, in the fourth iteration 714, five more additional points 708 are identified. Hence thirty three data points 702, 704, 706, 708 are considered in the fourth iteration 714 for generating the stochastic metamodel which characterizes the alloy properties in the design space with sufficient accuracy. It should be noted herein that the number of data points, temperature values, and strain-rate values discussed herein should not be construed as a limitation of the invention.

Figure 15:
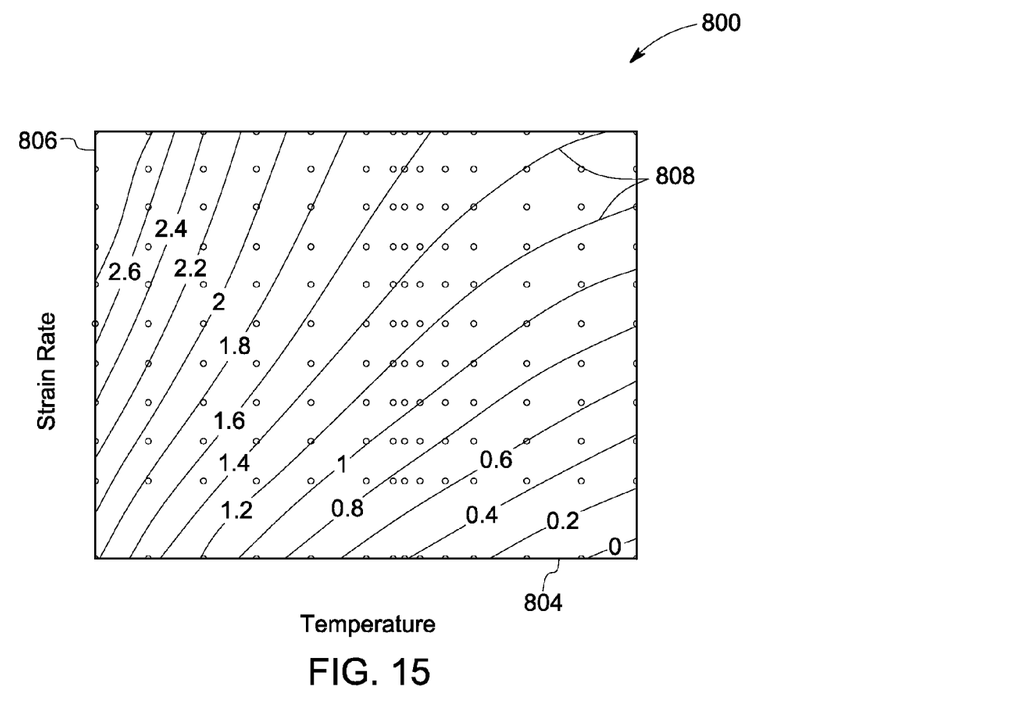
FIG. 15 illustrates a plot representative of flow stress properties of an alloy discussed in accordance with FIGS. 14A-14D having one hundred and fifty one data points in a design space in accordance with an exemplary embodiment.

FIG. 15 illustrates a plot 800 representative of the flow stress properties of the alloy discussed with reference to FIG. 14a having one hundred and fifty one data points of the design space. The x-axis 804 represents temperature values and the y-axis 806 represents strain-rate values. The curves 808 represent stress response and numerals on the curves 808 indicating the response values. In this example, the stress value at each data point is determined by a test experiment. The stress values at one hundred and fifty one data points are used to evaluate the intelligent point selection technique discussed with reference to FIGS. 14A-14D.

Figure 16:
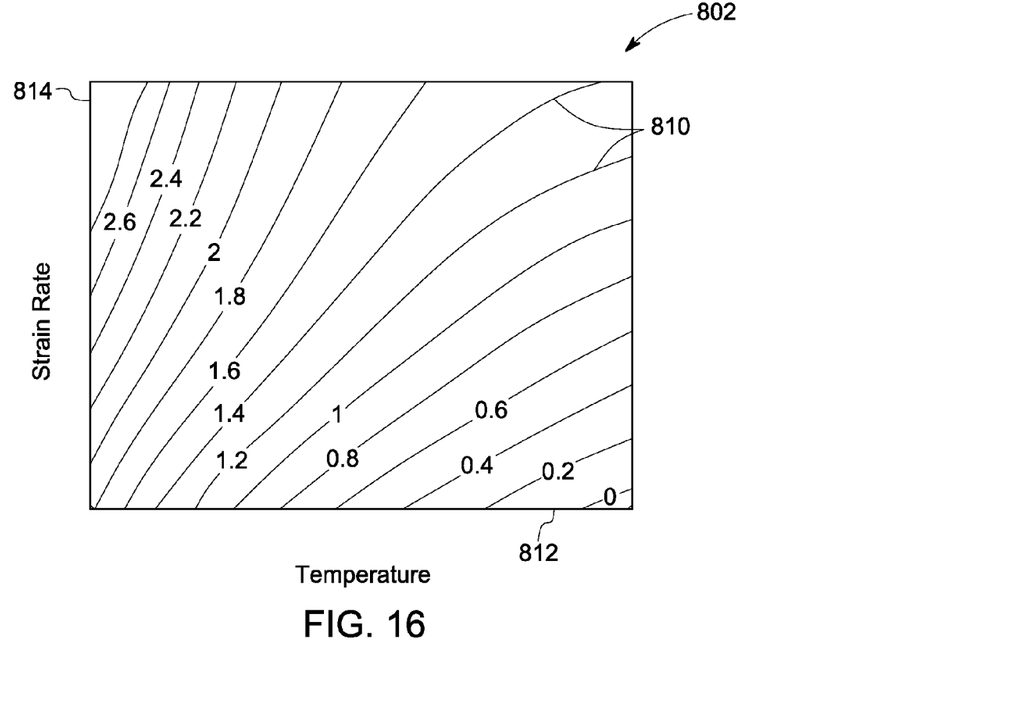
FIG. 16 illustrates a plot representative of flow stress properties of an alloy having thirty three data points discussed in accordance with FIGS. 14A-14D in accordance with an exemplary embodiment.

FIG. 16 illustrates a plot 802 representative of the flow stress properties of the alloy having thirty three data points discussed with reference to FIGS. 14A-14D. The x-axis 812 represents temperature values and the y-axis 814 represents strain-rate values. The curves 810 represent stress response and numerals on the curves 810 indicate response values. A small set of data points (first set of points) may be selected in a first iteration of the intelligent point selection method. In each subsequent iteration, the additional data points are near optimal and representative of major nonlinear components of the stress response. Similarity between alloy characteristics in FIG. 16 and FIG. 15 is indicative of the optimality of the proposed intelligent point selection technique. The complexity of the testing in the example of FIGS. 14A-14D is reduced by 80% compared to the complexity of testing by considering all the data points.

In accordance with the embodiments discussed herein, a technical effect is an intelligent point selection technique selects a subset of points from the design space reducing the complexity of testing or simulation. A metamodel, generated based on the first set of points, is evaluated for identifying a second set of points, different from the first set of points, based on the uncertainty value of the metamodel. The second set of points includes data points required to represent significant components of model nonlinearities. The second set of points and the first set of points are used for generating a better metamodel. Such a process is repeated until the plurality of uncertainty values over the entire design space falls below required levels or has ceased to improve. Instead of performing test experiments at all points of the design space, the technique uses limited number of test experiments at the first set of points. A smaller number of test experiments are performed at the second set of points where the nonlinearity (or uncertainty) of a response parameter of the design space is large. The intelligent point selection technique accurately predicts the regions of non-linearity and considers data points with information required to efficiently generate the metamodel.

It is to be understood that not necessarily all such objects or advantages described above may be achieved in accordance with any particular embodiment. Thus, for example, those skilled in the art will recognize that the systems and techniques described herein may be embodied or carried out in a manner that achieves or improves one advantage or group of advantages as taught herein without necessarily achieving other objects or advantages as may be taught or suggested herein.

While the technology has been described in detail in connection with only a limited number of embodiments, it should be readily understood that the invention are not limited to such disclosed embodiments. Rather, the technology can be modified to incorporate any number of variations, alterations, substitutions or equivalent arrangements not heretofore described, but which are commensurate with the spirit and scope of the claims. Additionally, while various embodiments of the technology have been described, it is to be understood that aspects of the inventions may include only some of the described embodiments. Accordingly, the inventions are not to be seen as limited by the foregoing description, but are only limited by the scope of the appended claims.

What is claimed as new and desired to be protected by Letters Patent of the United States is:

1. A method for simulation based testing of materials, comprising:
   i. selecting a first set of points from a data generated from a design space;
   ii. generating a stochastic metamodel based on the first set of points;
   iii. determining an uncertainty value based on the stochastic metamodel, wherein the uncertainty value is representative of variability of a prediction value generated from the stochastic metamodel;
   iv. identifying a second set of points different from the first set of points, from the data generated from the design space, based on the uncertainty value;
   v. combining the second set of points with the first set of points to generate a third set of points;
   vi. assigning the third set of points to the first set of points; and
   iteratively performing (ii)-(vi) till the uncertainty value is less than or equal to a predetermined threshold value.

2. The method of claim 1, further comprising generating the data having a plurality of points obtained from a plurality of randomly selected regions distributed along the design space.

3. The method of claim 1, wherein generating the stochastic metamodel comprises designing a global metamodel.

4. The method of claim 3, wherein designing the global metamodel comprises estimating a plurality of parameters of an artificial neural network.

5. The method of claim 1, wherein determining the uncertainty value further comprises determining a plurality of uncertainty values.

6. The method of claim 5, wherein determining the uncertainty value comprises determining a range of the plurality of uncertainty values.

7. The method of claim 5, wherein identifying the second set of points comprises selecting a point corresponding to a maximum value among the plurality of uncertainty values.

8. The method of claim 1, wherein determining the uncertainty value comprises computing a standard deviation of the prediction value generated from the stochastic metamodel.

9. A system for simulation based testing of materials, the system comprising:
   a processor based device configured to:
   i. select a first set of points from a data generated from a design space;
   ii. generate a stochastic metamodel based on the first set of points;
   iii. determine an uncertainty value based on the stochastic metamodel, wherein the uncertainty value is representative of variability of a prediction value generated from the stochastic metamodel;
   iv. identify a second set of points different from the first set of points, from the data generated from the design space, based on the uncertainty value;
   v. combine the second set of points with the first set of points to generate a third set of points;
   vi. assign the third set of points to the first set of points; and
   iteratively perform (ii)-(vi) till the uncertainty value is less than or equal to a predetermined threshold value.

10. The system of claim 9, wherein the processor based device is further configured to generate the data having a plurality of points obtained from a plurality of randomly selected regions distributed along the design space.

11. The system of claim 9, wherein the stochastic metamodel comprises a global metamodel.

12. The system of claim 11, wherein the global metamodel comprises an artificial neural network.

13. The system of claim 9, wherein the processor based device is further configured to determine a plurality of uncertainty values.

14. The system of claim 13, wherein the processor based device is further configured to determine a range of the plurality of uncertainty values.

15. The system of claim 13, wherein the processor based device is further configured to select a point corresponding to a maximum value among the plurality of uncertainty values.

16. The system of claim 1, wherein the processor based device is further configured to compute a standard deviation of the prediction value generated from the stochastic metamodel.

17. A non-transitory computer readable medium encoded with a program for simulation based testing of materials, to instruct a processor based device to:
  i. select a first set of points from a data generated from a design space;
  ii. generate a stochastic metamodel based on the first set of points;
  iii. determine an uncertainty value based on the stochastic metamodel, wherein the uncertainty value is representative of variability of a prediction value generated from the stochastic metamodel;
  iv. identify a second set of points different from the first set of points, from the data generated from the design space, based on the uncertainty value;
  v. combine the second set of points with the first set of points to generate a third set of points;
  vi. assign the third set of points to the first set of points; and iteratively perform (ii)-(vi) till the uncertainty value is less than or equal to a predetermined threshold value.

* * * * *